United States Patent
Sakurai

(10) Patent No.: US 8,367,539 B2
(45) Date of Patent: Feb. 5, 2013

(54) SEMICONDUCTOR DEVICE AND SEMICONDUCTOR DEVICE MANUFACTURING METHOD

(75) Inventor: Daisuke Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 60 days.

(21) Appl. No.: 13/040,318

(22) Filed: Mar. 4, 2011

(65) Prior Publication Data

US 2011/0233767 A1    Sep. 29, 2011

(30) Foreign Application Priority Data

Mar. 29, 2010    (JP) .................................. 2010-074492

(51) Int. Cl.
*H01L 21/44*    (2006.01)
*H01L 21/48*    (2006.01)

(52) U.S. Cl. . 438/612; 438/108; 438/613; 257/E21.508; 257/E23.023

(58) Field of Classification Search .................. 438/108, 438/612, 613; 257/E23.023, E21.508
See application file for complete search history.

(56) References Cited

U.S. PATENT DOCUMENTS

| 6,229,220 | B1 |   | 5/2001  | Saitoh et al. |              |
|-----------|----|---|---------|------------------|--------------|
| 6,624,522 | B2 | * | 9/2003  | Standing et al.  | 257/782      |
| 7,482,681 | B2 | * | 1/2009  | Standing         | 257/678      |
| 8,018,074 | B2 | * | 9/2011  | Sakai et al.     | 257/779      |
| 8,030,200 | B2 | * | 10/2011 | Eom et al.       | 438/612      |
| 2005/0042838 | A1 | * | 2/2005 | Garyainov et al. | 438/455     |
| 2005/0121784 | A1 | * | 6/2005 | Standing         | 257/737     |
| 2008/0165518 | A1 | * | 7/2008 | Ichiryu et al.   | 361/803     |
| 2008/0284046 | A1 | * | 11/2008 | Karashima et al. | 257/778    |
| 2009/0085227 | A1 | * | 4/2009 | Shiraishi et al. | 257/778     |
| 2010/0320596 | A1 | * | 12/2010 | Eom et al.       | 257/737    |

FOREIGN PATENT DOCUMENTS

| JP | 9-97791       | 4/1997  |
|----|---------------|---------|
| JP | 2003-282617 A | 10/2003 |

* cited by examiner

*Primary Examiner* — Nitin Parekh
(74) *Attorney, Agent, or Firm* — RatnerPrestia

(57) ABSTRACT

The semiconductor device manufacturing method includes the steps of attaching two or more solder particles on at least one electrode among a plurality of electrodes of an electronic component, arranging the electrode of the electronic component and an electrode of a circuit board so as to oppose each other, abutting the solder particles attached on a surface of the electrode of the electronic component to the electrode of the circuit board and heating the solder particles, and connecting electrically the electrode of the electronic component and the electrode of the circuit board via two or more solder joint bodies made by melting the solder particles.

12 Claims, 8 Drawing Sheets

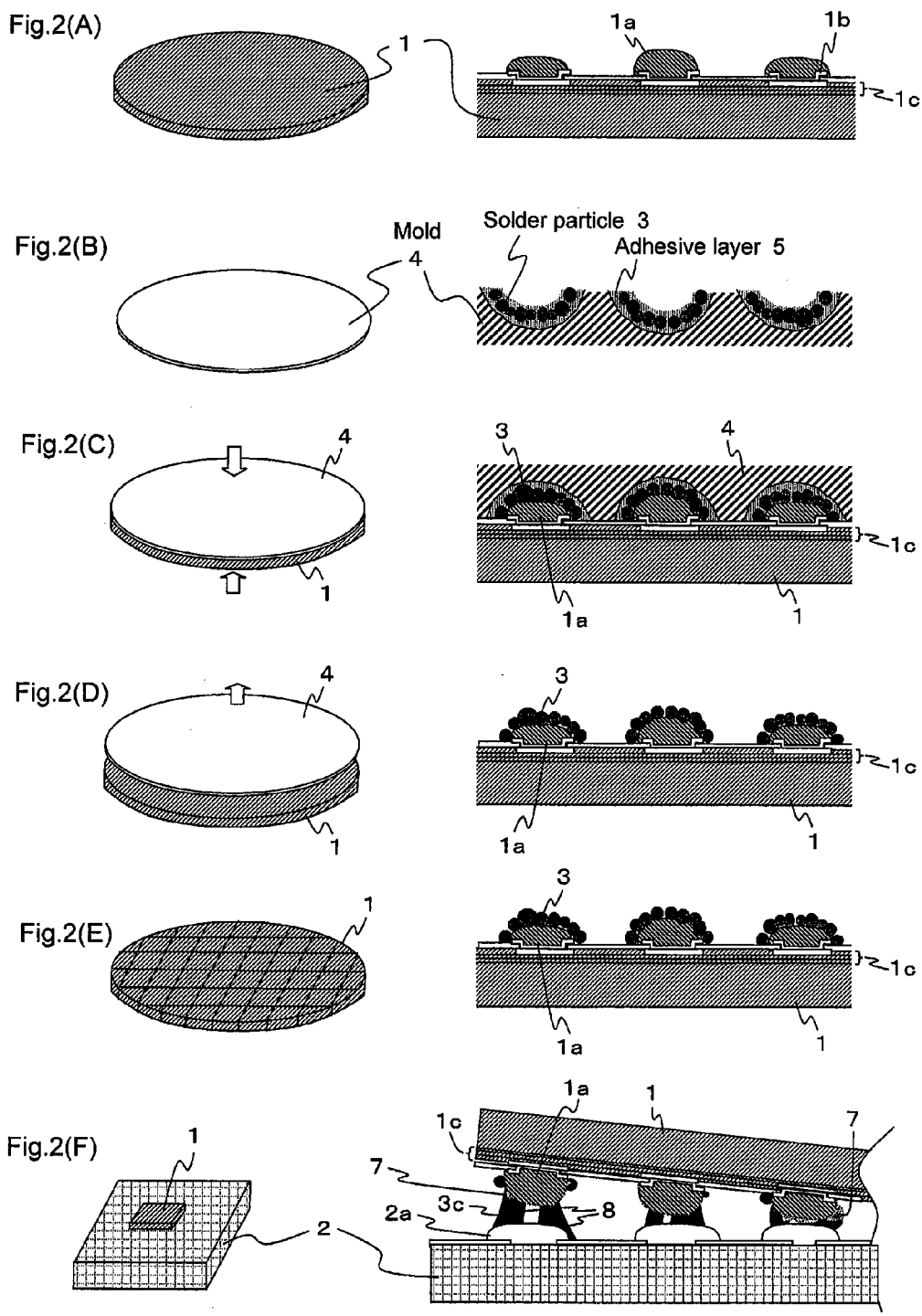

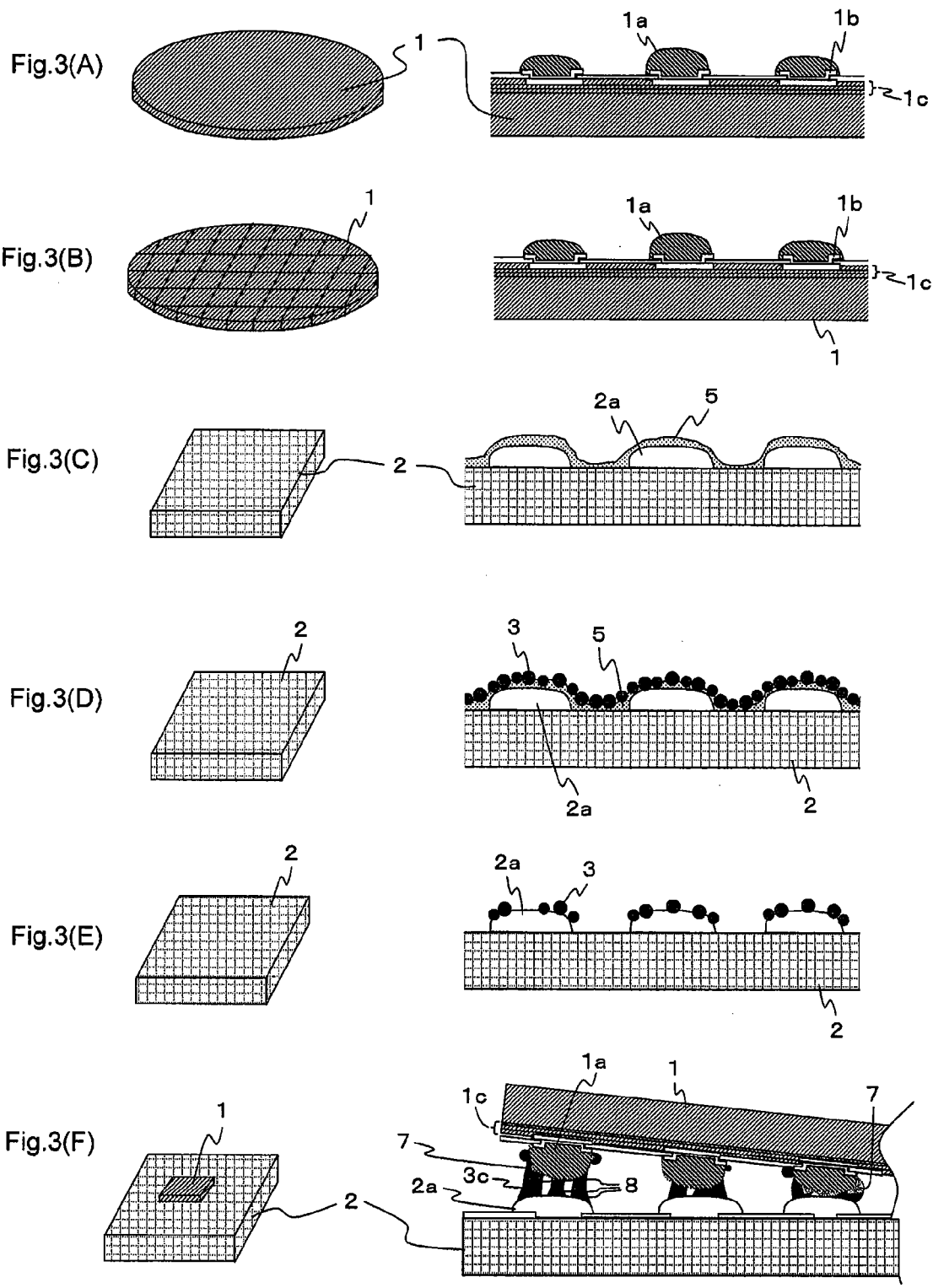

Fig.5(A)    Base material 6a
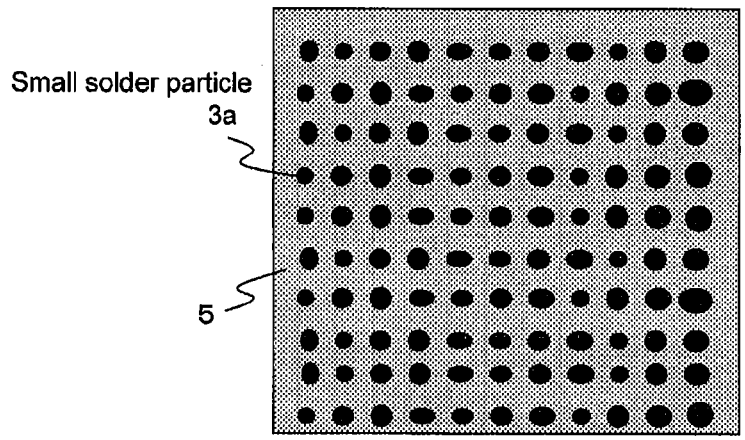
Small solder particle 3a
5
Fig.5(B)    Base material 6b
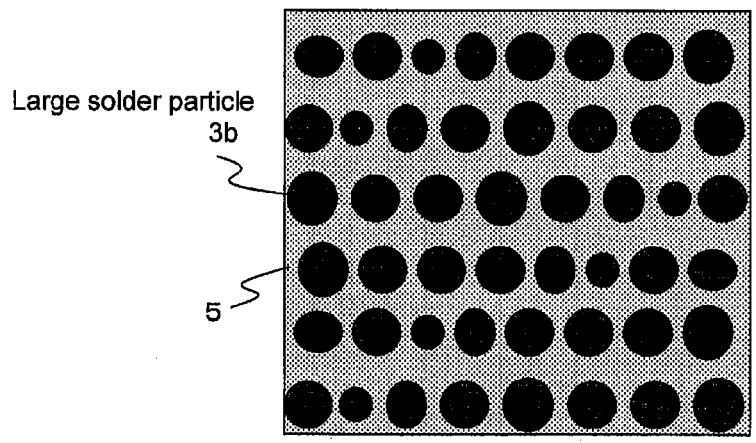
Large solder particle 3b
5
Fig.5(C)
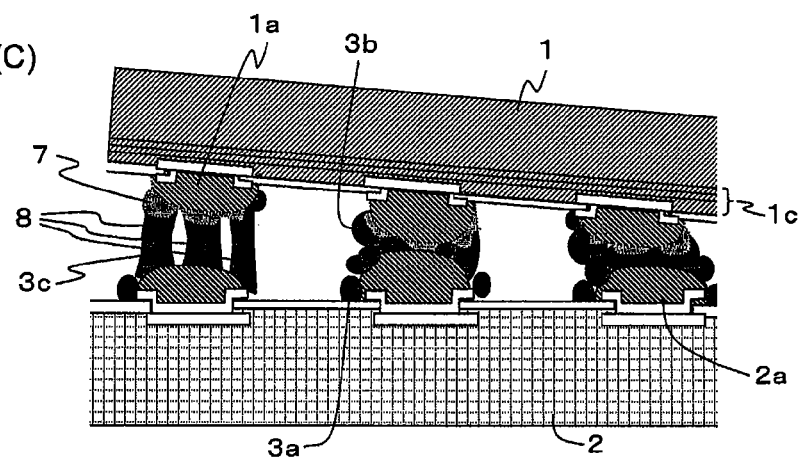

Base material 6c

Base material 6d

F ≦ f

SEMICONDUCTOR DEVICE AND SEMICONDUCTOR DEVICE MANUFACTURING METHOD

BACKGROUND OF THE INVENTION

1. Field of the Invention

The present invention relates to a semiconductor device and a semiconductor device manufacturing method.

2. Related Art of the Invention

In recent years, for the purpose of concurrently promoting densification of semiconductor elements and higher pin counts of electrode terminals, efforts have been made toward pitch reduction and area reduction in electrode terminals of semiconductor elements.

Typically, with flip-chip mounting, mounting is performed by forming a projecting electrode such as a solder bump on an electrode terminal of a semiconductor element such as an LSI, and pressure-welding and heating the semiconductor element faced downward with respect to a connecting terminal of a mounting board in order to perform bump connection.

However, since advances in pitch reduction have been significant, conventional means in which electrode terminals are peripherally arranged may result in an occurrence of a short-circuit between electrode terminals or an occurrence of a bad connection or the like due to a difference in coefficients of thermal expansion between a semiconductor element and a mounting board. In consideration thereof, a method of increasing the pitch between electrode terminals by arranging electrode terminals in an area array has been adopted. However, recent advances in pitch reduction have been significant even in area arrays.

As a method of forming a solder bump, a method has been adopted where solder is first formed on an electrode by screen printing, a method using a dispenser, or electrolytic plating, and then heated to a solder melting temperature or higher by a reflow furnace to form a projecting solder bump.

However, due to recent realizations in even narrower pitches of solder joints and smaller gaps between semiconductor elements and substrate electrodes, problems have emerged, such as a deformation of solder melted in a heating process during flip-chip mounting and a generation of a solder bridge defect where solder bumps become connected to each other due to surface tension of the solder.

A method of configuring a bump in two layers has been proposed in order to respond to such demands.

For example, there is a method of forming an insulating film containing metallic particles so as to cover a surface of a projecting electrode made of gold or copper (for example, refer to Japanese Patent Laid-Open No. 2003-282617). According to this method, electrical continuity can be established by a force in a compression direction due to cure shrinkage of an encapsulation resin injected between a semiconductor element and a substrate without having the insulating film or the projecting electrode melt during flip-chip mounting. As a result, bridge generation can be prevented and pitch reduction can be accommodated.

However, since recent demands for pitch reduction of pitches between electrodes are very strenuous, with a connection topology where continuity is secured solely by contact without any diffusion bonding between metallic particles and metallic electrodes as is the case with Japanese Patent Laid-Open No. 2003-282617, a reduction in electrode area obviously reduces the number of conductive particles interposed between electrodes and creates a problem of higher connection resistance and greater signal transmission loss.

In consideration thereof, a method has been adopted in which a bump is configured in two layers, namely, a lower layer metal and an upper layer metal, and the upper layer metal made of solder is formed on top of the lower layer metal made of high-melting point metal (for example, refer to Japanese Patent Laid-Open No. 9-97791).

FIG. 7 is a cross-sectional view conceptually illustrating a semiconductor device according to an embodiment described in Japanese Patent Laid-Open No. 9-97791.

An electrode 11a made of a high-melting point metal is formed on a semiconductor element 11, and solder 13 is formed on the electrode 11a. By positioning the electrode 11a on the semiconductor element 11 so as to oppose an electrode 12a formed on a circuit board 12, mounting the semiconductor element 11 onto the circuit board 12, and applying heat and pressure, entire surfaces of the electrode 11a on the semiconductor element 11 and the electrode 12a on the circuit board 12 are diffusion-bonded by the solder 13.

According to this method, the amount of solder can be reduced compared to a bump made of a single solder layer, the amount of solder collapse in a planar direction during flip-chip mounting can be reduced, and generation of a solder bridge can be prevented. In addition, since the solder and the board electrode are diffusion-bonded, connection resistance can be kept low and an increase in signal transmission loss can be avoided.

SUMMARY OF THE INVENTION

However, applying the semiconductor device manufacturing technique according to Japanese Patent Laid-Open No. 9-97791 described above on a semiconductor element that uses a low-dielectric-constant film as an interlayer dielectric film problematically causes peeling or cracking of the fragile low-dielectric-constant film during a cooling process after melting of solder in a flip-chip process.

Low-dielectric-constant films (such as so-called Low-k films and ULK (Ultra Low-k) films) are being used as interlayer dielectric films of semiconductor elements for the purpose of accommodating recent demands for wiring rule miniaturization and high-speed signal processing. In order to lower a dielectric constant, a low-dielectric-constant film itself is configured so as to be porous, having a large number of holes in the order of several nm.

FIGS. 8(A) and 8(B) are cross-sectional views conceptually illustrating a semiconductor device during a cooling process after melting of solder in a flip-chip process when the semiconductor device manufacturing technique according to Japanese Patent Laid-Open No. 9-97791 is applied on a semiconductor element 15 that uses such a low-dielectric-constant insulating film 14.

When a semiconductor device manufacturing technique such as that described in Japanese Patent Laid-Open No. 9-97791 is applied, during a cooling process after melting of solder in a flip-chip process, thermal stress is generated in a direction where the semiconductor element 15 warps with respect to the circuit board 12 due to differences in elastic modulus and linear coefficients of expansion between the semiconductor element 15 and the circuit board 12. The thermal stress is to concentrate at a junction of a solder 13 in a corner section of the semiconductor element 15. Therefore, the thermal stress is directly transmitted to immediately beneath an electrode 11a of the semiconductor element 15 and, as illustrated in FIGS. 8(A) and 8(B), peeling or cracking of the fragile low-dielectric-constant insulating film 14 immediately beneath the electrode 11a problematically occurs.

In addition, even in a usage environment where a temperature difference occurs rapidly, a similar thermal stress concentration is generated to problematically cause peeling or cracking of the fragile low-dielectric-constant insulating film 14 immediately beneath the electrode 11a.

The present invention has been made in consideration of the problems described above, and an aspect of the present invention is to provide, with respect to a semiconductor element having a fragile film, a semiconductor device capable of ensuring high connection reliability with a simple structure and a method of manufacturing the semiconductor device.

To solve the above-described problems, the $1^{st}$ aspect of the present invention is a semiconductor device having electrodes of an electronic component and electrodes of a circuit board arranged so as to oppose the electrodes of the electronic component, both the electrodes being joined via a solder, wherein at least one electrode set is joined via two or more solder joint bodies, the one electrode set having the electrode of the electronic component and the electrode of the circuit board being arranged so as to oppose each other.

The $2^{nd}$ aspect of the present invention is the semiconductor device according to the $1^{st}$ aspect of the present invention, wherein there is a plurality of the electrode sets, and the electrode of the electronic component and the electrode of the circuit board having a largest opposite space are joined via two or more solder joint bodies.

The $3^{rd}$ aspect of the present invention is a semiconductor device manufacturing method comprising the steps of:

attaching two or more solder particles on at least one electrode among a plurality of electrodes of an electronic component;

arranging the electrode of the electronic component and an electrode of a circuit board so as to oppose each other;

abutting the solder particles attached on a surface of the electrode of the electronic component to the electrode of the circuit board; and heating the solder particles, wherein the electrode of the electronic component and the electrode of the circuit board are connected electrically via two or more solder joint bodies made by melting the solder particles.

The $4^{th}$ aspect of the present invention is a semiconductor device manufacturing method comprising the steps of:

attaching two or more solder particles on at least one electrode among a plurality of electrodes of a circuit board;

arranging the electrode of the circuit board and an electrode of an electronic component so as to oppose each other;

abutting the solder particles attached on surfaces of the electrode of the circuit board to the electrode of the electronic component; and heating the solder particles, wherein the electrode of the circuit board and the electrode of the electronic component are connected electrically via two or more solder joint bodies made by melting the solder particles.

The $5^{th}$ aspect of the present invention is a semiconductor device manufacturing method comprising the steps of:

attaching two or more first solder particles on at least one electrode among a plurality of electrodes of an electronic component;

attaching two or more second solder particles on at least one electrode among a plurality of electrodes of a circuit board;

arranging the electrode of the electronic component and the electrode of the circuit board so as to oppose each other;

performing at least one of abutting the first solder particles to the electrode of the circuit board, abutting the second solder particles to the electrode of the electronic component, and abutting the first solder particles to the second solder particles; and heating the first solder particles and the second solder particles, wherein in at least one set of electrodes arranged so as to oppose each other, the electrode of the circuit board and the electrode of the electronic component are connected electrically via two or more solder joint bodies made by melting the first solder particles and the second solder particles.

The $6^{th}$ aspect of the present invention is the semiconductor device manufacturing method according to the $5^{th}$ aspect of the present invention, wherein the first solder particles attached on the surface of the electrode of the electronic component and the second solder particles attached on the surface of the electrode of the circuit board have different particle spaces.

The $7^{th}$ aspect of the present invention is the semiconductor device manufacturing method according to the $5^{th}$ aspect of the present invention, wherein the first solder particles attached on the surface of the electrode of the electronic component and the second solder particles attached on the surface of the electrode of the circuit board have different particle diameters.

The $8^{th}$ aspect of the present invention is the semiconductor device manufacturing method according to the $6^{th}$ aspect of the present invention, wherein the first solder particles attached on the surface of the electrode of the electronic component and the second solder particles attached on the surface of the electrode of the circuit board have different particle diameters.

The $9^{th}$ aspect of the present invention is the semiconductor device manufacturing method according to the $5^{th}$ aspect of the present invention, wherein the particle space of the first solder particles attached on the surface of the electrode of the electronic component is greater than the particle diameter of the second solder particles attached on the surface of the electrode of the circuit board.

The $10^{th}$ aspect of the present invention is the semiconductor device manufacturing method according to the $5^{th}$ aspect of the present invention, wherein the particle space of the second solder particles attached on the surface of the electrode of the circuit board is greater than the particle diameter of the first solder particles attached on the surface of the electrode of the electronic component.

The $11^{th}$ aspect of the present invention is the semiconductor device manufacturing method according to the $6^{th}$ aspect of the present invention, wherein the particle space of the first solder particles attached on the surface of the electrode of the electronic component is greater than the particle diameter of the second solder particles attached on the surface of the electrode of the circuit board.

The $12^{th}$ aspect of the present invention is the semiconductor device manufacturing method according to the $7^{th}$ aspect of the present invention, wherein the particle space of the first solder particles attached on the surface of the electrode of the electronic component is greater than the particle diameter of the second solder particles attached on the surface of the electrode of the circuit board.

The $13^{th}$ aspect of the present invention is the semiconductor device manufacturing method according to the $8^{th}$ aspect of the present invention, wherein the particle space of the first solder particles attached on the surface of the electrode of the electronic component is greater than the particle diameter of the second solder particles attached on the surface of the electrode of the circuit board.

The 14th aspect of the present invention is the semiconductor device manufacturing method according to the 6th aspect of the present invention, wherein the particle space of the second solder particles attached on the surface of the electrode of the circuit board is greater than the particle diameter of the first solder particles attached on the surface of the electrode of the electronic component.

The 15th aspect of the present invention is the semiconductor device manufacturing method according to the 7th aspect of the present invention, wherein the particle space of the second solder particles attached on the surface of the electrode of the circuit board is greater than the particle diameter of the first solder particles attached on the surface of the electrode of the electronic component.

The 16th aspect of the present invention is the semiconductor device manufacturing method according to the 8th aspect of the present invention, wherein the particle space of the second solder particles attached on the surface of the electrode of the circuit board is greater than the particle diameter of the first solder particles attached on the surface of the electrode of the electronic component.

With flip-chip mounting of a semiconductor element of a semiconductor device, it is capable of ensuring high connection reliability by applying the semiconductor device and the semiconductor device manufacturing method described above The present invention can provide, with respect to a semiconductor element having a fragile film, a semiconductor device capable of ensuring high connection reliability with a simple structure and a method of manufacturing the semiconductor device.

BRIEF DESCRIPTION OF THE DRAWINGS

FIGS. 2(A) to 2(F) are cross-sectional views conceptually illustrating a semiconductor device manufacturing method according to the first embodiment of the present invention;

FIGS. 3(A) to 3(F) are cross-sectional views conceptually illustrating a semiconductor device manufacturing method according to a second embodiment of the present invention;

FIGS. 5(A) and 5(B) are plan views conceptually illustrating a solder particle-adhering base material according to the third embodiment of the present invention, and FIG. 5(C) is a cross-sectional view conceptually illustrating a semiconductor device according to the third embodiment of the present invention;

Figure 1:
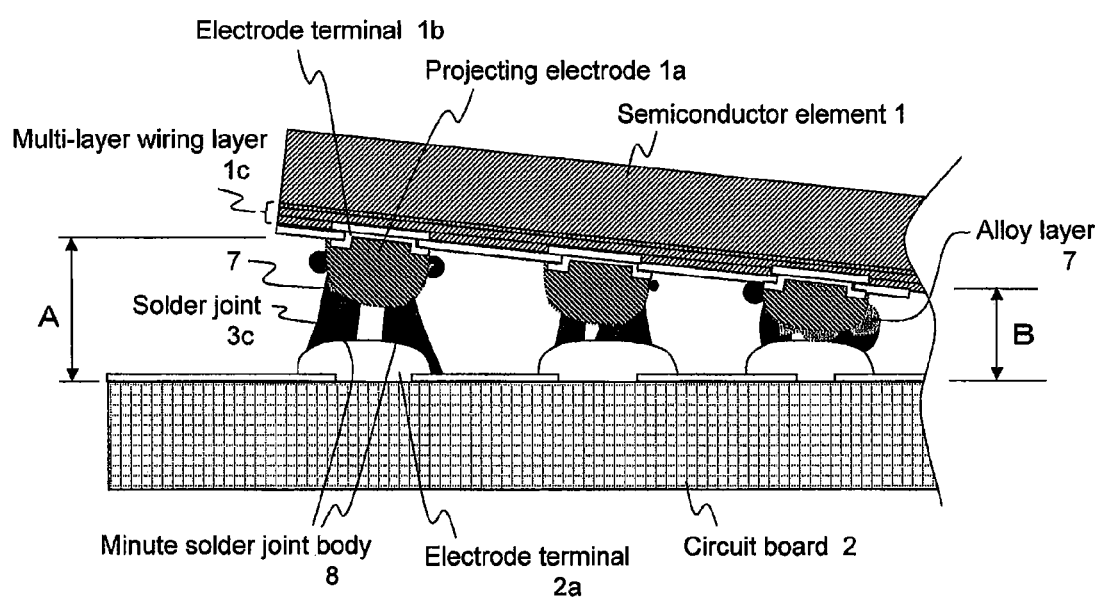
FIG. 1 is a cross-sectional view conceptually illustrating a semiconductor device according to a first embodiment of the present invention.

DESCRIPTION OF SYMBOLS 1, 11, 15 Semiconductor element
1a Projecting electrode
1b, 2a Electrode terminal
1c Multi-layer wiring layer
2, 12 Circuit board
3 Solder particle
3a Small solder particle
3b Large solder particle
3c Solder joint
4 Mold
5 Adhesive layer
6, 6a, 6b, 6c, 6d Base material
7 Alloy layer
8 Minute solder joint body
11a, 12a Electrode
13 Solder
14 Low-dielectric-constant insulating film

PREFERRED EMBODIMENTS OF THE INVENTION

Hereinafter, embodiments of the present invention will be described in detail with reference to the drawings.
(First Embodiment)

FIG. 1 is a cross-sectional view conceptually illustrating a semiconductor device according to a first embodiment of the present invention.

A multi-layer wiring layer 1c including a micro-wiring layer made of Cu, Al, or the like and a fragile low-dielectric-constant insulating film (for example, a Low-k layer or an Ultra Low-k layer) is provided as an inner layer of an electrode surface of a semiconductor element 1. A plurality of electrode terminals 1b are provided in an area arrangement on an outermost surface of the multi-layer wiring layer 1c. The electrode terminals 1b are made of, for example, Al or Cu. A seed layer made of Ti/Cu, Ti/W/Cu, or the like is provided on the electrode terminals 1b, and projecting electrodes 1a made of a solder-wetting metal such as Ni/Au, Au, and Cu are provided on the seed layer.

Meanwhile, a circuit board 2 (for example, constituted by a glass/epoxy multilayer board, an aramid multilayer board, or silicon) mounted with the semiconductor element 1 has electrode terminals 2a arranged so as to oppose the projecting electrodes 1a of the semiconductor element 1. The electrode terminals 2a are made of Ni/Au, Ni/Pd/Au, or the like.

Moreover, the semiconductor element 1 corresponds to an example of an electronic component according to the present invention. In addition, the projecting electrode 1a corresponds to an electrode of an electronic component according to the present invention, and the electrode terminal 2a corresponds to an electrode of a circuit board according to the present invention.

The projecting electrode 1a of the semiconductor element 1 and the electrode terminal 2a of the circuit board 2 are electrically and mechanically connected by a solder joint 3c. A solid-phase diffusion reaction or a solid-liquid diffusion reaction occurs between the solder joint 3c and the projecting electrode 1a and between the solder joint 3c and the electrode terminal 2a, forming an alloy layer 7 therebetween and achieving a strong joint.

In this case, the solder joint 3c between electrodes at a position (A in FIG. 1) whose space between the semiconductor element 1 and the circuit board 2 (B in FIG. 1) is the largest is made up of two minute solder joint bodies 8.

The minute solder joint body 8 corresponds to an example of a solder joint body according to the present invention.

During a cooling process after melting of solder in a solder melting process when manufacturing the semiconductor device, due to a difference in linear coefficients of expansion between the semiconductor element 1 and the circuit board 2, warping is most likely to occur in a vicinity of a joint portion at an outermost position of the semiconductor element 1 and the space between the semiconductor element 1 and the circuit board 2 is likely to be the largest at the outermost position.

In addition, in the plane of the semiconductor element 1, thermal stress is greatest in a vicinity of a joint portion at an outermost position. Since the position A whose space is the greatest is subjected to the largest thermal stress, by performing a connection with two minute solder joint bodies 8, the projecting electrode 1a and the electrode terminal 2a are connected at a smaller area than when a single minute solder joint body is used. By receiving a force in a tensile direction at the small-area connection portion, stress concentration to the solder portion increases and a stress concentration point is transferred from the multi-layer wiring layer 1c including the fragile low-dielectric-constant insulating film to the solder joint 3c.

However, even if the stress concentration point is transferred to the solder joint 3c, since the solder joint 3c made up of the two minute solder joint bodies 8 have a high elongation and the projecting electrode 1a and the electrode terminal 2a are strongly joined, the solder joint 3c expands without being damaged, thereby enabling peeling or cracking of the fragile low-dielectric-constant insulating film of the multi-layer wiring layer 1c to be prevented.

Possible compositions of the solder may include SnAg, SnAgCu, SnZn, SnZnBi, SnPb, SnBi, SnAgBiIn, SnIn, In, and Sn. Materials can be selected freely based on the elongation of the solder in accordance with the magnitude of the maximum space A.

For example, when the space between the electrode terminals 1b of the semiconductor element 1 is 0.05 mm, the diameter of the projecting electrodes 1a ranges from 0.020 to 0.035 mm, the height thereof ranges from 0.05 to 0.20 mm, the diameter of the electrode terminals 2a of the circuit board 2 ranges from 0.020 to 0.035 mm, the height thereof ranges from 0.05 to 0.10 mm, the diameter of the minute solder joint bodies 8 ranges from 0.002 to 0.010 mm, and the elongation of the diameter is 50%.

Although not illustrated, the space between the semiconductor element 1 and the electrode surface of the circuit board 2 may be filled with an encapsulation resin. Filling with the encapsulation resin further improves reliability.

FIGS. 2(A) to 2(F) are cross-sectional views conceptually illustrating a semiconductor device manufacturing method according to the present first embodiment. Like components to those illustrated in FIG. 1 are denoted by like reference characters.

The semiconductor device manufacturing method according to the present first embodiment will now be described with reference to FIG. 2.

First, as illustrated in FIG. 2(A), a seed layer is formed on an entire electrode surface of the wafer-form semiconductor element 1 using a sputtering method or by vapor deposition. Next, a metallic layer is formed on the entire surface using an electrolytic plating method. After forming a photosensitive resist layer and exposing formation portions of the projecting electrodes 1a at positions of the electrode terminals 1b, the photosensitive resist is peeled off using stripping liquid. As a result of this process, the projecting electrodes 1a are formed above the electrode terminals 1b. For example, while Ti/Cu has been used as the seed layer and Ni/Au as the metallic layer, such an arrangement is not restrictive. Moreover, before forming the seed layer, the multi-layer wiring layer 1c including the fragile low-dielectric-constant insulating film is formed on an electrode surface-side of the semiconductor element 1.

Next, as illustrated in FIG. 2(B), after an adhesive layer 5 is supplied by spraying or using a dispenser on an entire inner surface of a transfer mold 4 that is hollowed out in larger shapes than the projecting electrodes 1a in accordance with the positions of the projecting electrodes 1a, solder particles 3 are uniformly attached on the entire surface.

Next, as illustrated in FIG. 2(C), the mold 4 and the semiconductor element 1 are aligned so that the projecting electrodes 1a of the semiconductor element 1 and depressed holes provided on the mold 4 and corresponding to the projecting electrodes 1a oppose each other, and subjected to heating and pressurization. Accordingly, heating and pressurization are performed under temperature and time conditions that enable the solder particles 3 and the projecting electrodes 1a to melt and the respective solder particles 3 to retain their particle shapes. At this point, using fine solder particles 3 increases an area occupied by an oxide film, making it easier to inhibit melting and enabling diffusion in a state where particle shapes are retained. For example, when the diameter of the solder particles 3 ranges from 0.002 to 0.008 mm, pressurization is performed under atmospheric pressure at a temperature of the mold 4 of 210° C. for a pressurization time of 10 to 50 seconds.

Next, as illustrated in FIG. 2(D), by peeling off the mold 4 from the semiconductor element 1, projecting electrodes 1a are formed on which solder particles 3 are attached in particle shapes. Subsequently, as illustrated in FIG. 2(E), the semiconductor element 1 is diced by means such as blade dicing and laser dicing.

Next, as illustrated in FIG. 2(F), after aligning the semiconductor element 1 with the electrode terminals 2a of the circuit board 2 so that the electrode terminals 2a oppose the projecting electrodes 1a of the semiconductor element 1, heat is applied, and the semiconductor element 1 is mounted onto the circuit board 2 at a low load while applying a lifting load. In doing so, although the solder liquefies, under a low load, pressure is applied up to a level where adjacent solder particles 3 are not integrated with each other. For example, pressurization is to be performed at a heating temperature ranging from 220 to 240° C. for a pressurization time ranging from 3 to 10 seconds. Moreover, flux may be supplied before mounting the semiconductor element 1. Even with the particle-shaped fine solder particles 3 that are difficult to melt, the use of flux improves solder wettability and makes it easier to form the minute solder joints 3c.

At this point, by mounting under a low load in a state where the solder is liquefied, the semiconductor element 1 and the circuit board 2 are pushed into each other in a nonparallel, inclined state, negatively affecting the parallelism of the semiconductor element 1 and the circuit board 2. However, even between electrodes at a location at an end of the semiconductor element 1 where the distance from the circuit board 2 is greatest, since a portion of the minute solder joint body 8 expands in a drum shape and achieves a joint as illustrated in FIG. 2(F), the deterioration in parallelism can be absorbed.

During a cooling process after melting of solder in a solder melting process illustrated in FIG. 2(F) when mounting the semiconductor element 1 on the circuit board 2, the liquefied solder particles 3 expand at or above the melting point of solder, and the solder solidifies as soon as the temperature falls below the freezing point of the solder and maintains its shape. When subjected to further cooling, since the space between the solder joints 3c is inclined to expand due to a difference in the linear coefficients of expansion between the semiconductor element 1 and the circuit board 2, the solid solder joint 3c expands within an elastic range and the semiconductor device is completed.

A minute solder in a state of expansion in a drum shape such as the solder joint 3c illustrated in FIG. 2(F) will be defined as a "minute solder joint body 8". The projecting electrodes 1a of the semiconductor element 1 and the electrode terminals 2a of the circuit board 2 are electrically connected by two or more minute solder joint bodies 8. In this case, electrodes at a location having the smallest distance between the semiconductor element 1 and the circuit board 2 may be electrically connected to each other by a plurality of minute solder joint bodies 8 or may be electrically connected to each other by a single solder joint body as is conventional.

A cross-sectional analysis by cross section polish of a semiconductor device fabricated by the manufacturing method according to the present first embodiment confirmed that the solder joint 3c at an outermost position is made up of two minute solder joint bodies 8 and that no peeling and cracking had occurred at the fragile low-dielectric-constant insulating film included in the multi-layer wiring layer 1c. Furthermore, a temperature cycling test (1 cycle: −45° C., 85° C., each for 5 minutes) performed on the semiconductor device revealed that stable connection resistance can be secured even at 1000 cycles.

With the semiconductor device fabricated by the manufacturing method according to the present first embodiment, since the minute solder joint body 8 expands and contracts in response to a temperature change under a usage environment within an elastic range of the solder joint 3c, thermal stress is absorbed and alleviated at the portion of the solder joint 3c to prevent stress from being transferred to immediately underneath the electrodes. Therefore, stable connection resistance can be secured during use in this manner.

As shown, by constituting the solder joint 3c at a position having the largest space between the semiconductor element 1 and the circuit board 2 with two minute solder joint bodies 8, stress acting on the fragile low-dielectric-constant insulating film can be reduced and high connection reliability can be secured.

(Second Embodiment)

FIGS. 3(A) to 3(F) are cross-sectional views conceptually illustrating a semiconductor device manufacturing method according to a second embodiment of the present invention. Like components to those illustrated in FIGS. 1 and 2 are denoted by like reference characters.

The semiconductor device manufacturing method according to the present second embodiment will now be described with reference to FIG. 3.

First, as illustrated in FIG. 3(A), a seed layer is formed on an entire electrode surface of a wafer-form semiconductor element 1 using a sputtering method or by vapor deposition. Next, a metallic layer is formed on the entire surface using an electrolytic plating method. After forming a photosensitive resist layer and exposing formation portions of projecting electrodes 1a at positions of electrode terminals 1b, the photosensitive resist is peeled off using stripping liquid. As a result of this process, the projecting electrodes 1a are formed above the electrode terminals 1b. For example, while Ti/Cu has been used as the seed layer and Cu as the metallic layer, such an arrangement is not restrictive. Moreover, a multi-layer wiring layer 1c including a fragile low-dielectric-constant insulating film is formed on an electrode surface-side of the semiconductor element 1.

Next, as illustrated in FIG. 3(B), the semiconductor element 1 is diced using a dicing blade or by laser processing.

Next, as illustrated in FIG. 3(C), projecting electrode terminals 2a are formed using an electroless plating method on a circuit board 2 constituted by a glass-epoxy multilayer board. For example, for the composition of the electrode terminals 2a, materials with good solder wettability such as Ni/Au, Ni/Pd/Au, and Cu are selected. Subsequently, in order to uniformly attach solder particles 3 over an entire surface, an adhesive layer 5 is supplied over the entire surface of the circuit board 2 by a method using a spray, a dispenser, or the like.

Next, as illustrated in FIG. 3(D), the circuit board 2 with solder particles 3 uniformly attached on the entire surface thereof is heated by heating means such as a reflow furnace at temperature, time, and gas atmosphere conditions which enable the solder particles 3 and the electrode terminals 2a to melt and particle shapes to be retained without creating solder bridges in a planar direction. At this point, since using fine solder particles 3 increases an area occupied by an oxide film and makes it easier to inhibit melting, diffusion is enabled in a state where particle shapes are retained without causing a solder bridge between adjacent terminals. For example, heating is performed using Sn3.0Ag0.5Cu as the solder with a solder particle diameter ranging from 0.003 to 0.008 mm under a temperature of 225° C. and a formic acid gas atmosphere for a pressurization time of 3 to 8 seconds.

Next, as illustrated in FIG. 3(E), the circuit board 2 is submerged in a cleaning solution and cleaned by applying ultrasonic waves. As a result of this process, solder particles 3 existing between electrode terminals 2a are removed and attached on the projecting electrode terminals 2a in a state where the solder particles 3 are diffusion-bonded to the electrode terminals 2a.

Next, as illustrated in FIG. 3(F), after aligning the semiconductor element 1 with the electrode terminals 2a of the circuit board 2 so that the electrode terminals 2a oppose the projecting electrodes 1a of the semiconductor element 1, heat is applied, and the semiconductor element 1 is mounted onto the circuit board 2 at a low load while applying a lifting load. In doing so, although the solder liquefies, under a low load, pressure is applied up to a level where adjacent solder particles 3 are not integrated with each other. For example, pressurization is to be performed at a heating temperature ranging from 250 to 260° C. for a pressurization time ranging from 3 to 10 seconds under a nitrogen gas atmosphere. Moreover, flux or an encapsulation resin containing a flux component may be supplied before mounting the semiconductor element 1. Even with the fine solder particles that are difficult to melt, the use of flux improves solder wettability and makes it easier to form a minute solder joint bodies 8. At this point, although parallelism of the semiconductor element 1 and the circuit board 2 is negatively affected by mounting with a low load, since a portion of the minute solder joint body 8 expands in a drum shape and achieves a joint as illustrated in FIG. 3(F), the deterioration in parallelism can be absorbed.

A cross-sectional analysis by cross section polish of a semiconductor device fabricated by the manufacturing method according to the present second embodiment confirmed that the space between the semiconductor element 1 and the circuit board 2 is largest at the outermost projecting electrode 1a and electrode terminal 2a, and an outermost solder joint 3c is made up of three minute solder joint bodies 8 and that no peeling and cracking had occurred at the fragile low-dielectric-constant insulating film included in the multilayer wiring layer 1c. Furthermore, a temperature cycling test (1 cycle: −45° C., 85° C., each for 5 minutes) performed on the semiconductor device revealed that stable connection resistance can be secured even at 1000 cycles.

As shown, even in a case where the solder particles 3 are attached on an electrode-side of the circuit board 2 instead of the electrode-side of the semiconductor element 1, by constituting the solder joint 3c at a position having the largest space between the semiconductor element 1 and the circuit board 2 with two or more minute solder joint bodies 8, stress acting on the fragile low-dielectric-constant insulating film can be reduced and high connection reliability can be secured.
(Third Embodiment)

FIGS. 4(A) to 4(I) are cross-sectional views conceptually illustrating a semiconductor device manufacturing method according to a third embodiment of the present invention. Like components to those illustrated in FIGS. 1 and 2 are denoted by like reference characters.

The semiconductor device manufacturing method according to the present third embodiment will now be described with reference to FIG. 4.

Figure 4A:
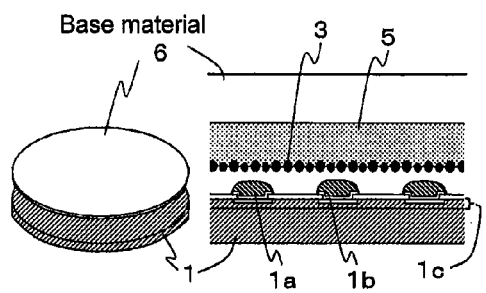
FIGS. 4(A) to 4(I) are cross-sectional views conceptually illustrating a semiconductor device manufacturing method according to a third embodiment of the present invention.

First, as illustrated in FIG. 4(A), projecting electrodes 1a made of Ni—P/Au are formed using an electroless plating method on electrode terminals 1b made of Al of a wafer-form semiconductor element 1 made of silicon.

Meanwhile, an adhesive layer 5 is applied on an entire surface of a base material 6 made of PET, PEN, or the like by means such as a spray, a dispenser, a bar coater, a spin coater, or the like, and solder particles 3 are attached to the adhesive layer 5 so as to be uniformly distributed. For example, as the solder particles 3, particles with a composition of Sn3.5Ag8.0In0.5Bi and a particle diameter ranging from 0.002 to 0.006 mm can be used.

Figure 4E:
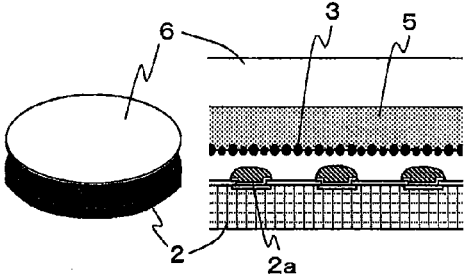
Figure 4B:
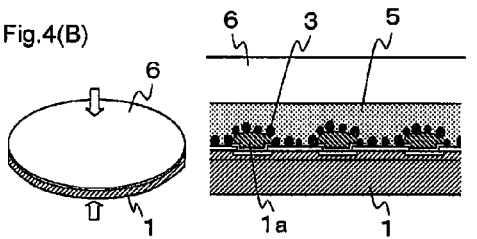

Next, as illustrated in FIG. 4(B), the surface of the base material 6 to which the solder particles 3 are attached and the surface of the semiconductor element 1 with the projecting electrodes 1a are attached to each other while applying heat and pressure. In this case, heating and pressurization are performed under temperature and time conditions that enable the solder particles 3 to melt locally and diffusion-bond to the projecting electrodes 1a and particle shapes to be retained without creating solder bridges in a planar direction.

Moreover, while a material having a function for causing the solder particles 3 to be held by the base material 6, a function for removing a solder oxide film, and a demolding function is desirably used as the adhesive layer 5, such an arrangement is not restrictive. Although not illustrated, a material such as flux or a mold release agent may further be supplied on top of the base material 6.

Figure 4F:
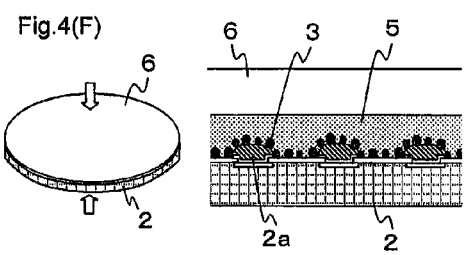
Figure 4C:
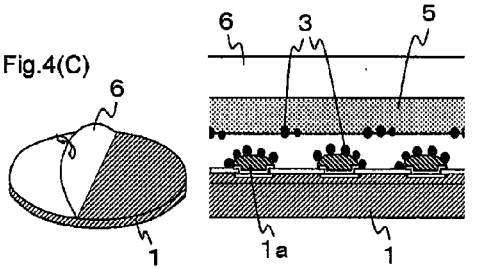

Next, as illustrated in FIG. 4(C), the base material 6 is separated from the semiconductor element 1 while being heated. As a result of this process, the solder particles 3 existing between the projecting electrodes 1a are removed from the semiconductor element 1 while remaining attached to the side of the base material 6, and are attached on the projecting electrodes 1a in a state where the solder particles 3 are diffusion-bonded to the projecting electrodes 1a.

Figure 4G:
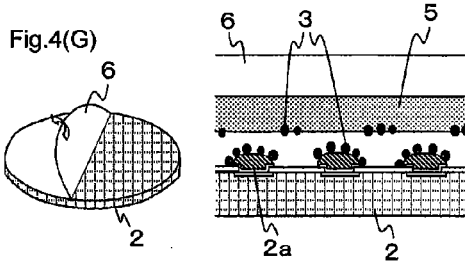

Next, in processes of FIGS. 4(E) to 4(G) of a wafer-form circuit board 2 made of silicon which are similar to the processes of the semiconductor element 1 illustrated in FIGS. 4(A) to 4(C), the solder particles 3 are attached on electrode terminals 2a of the circuit board 2 in a state where the solder particles 3 are diffusion-bonded to the electrode terminals 2a.

Figure 4D:
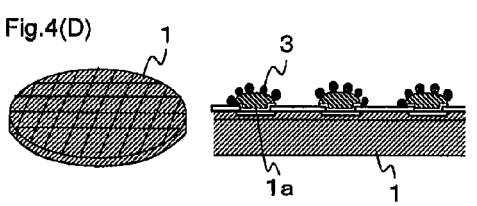
Figure 4H:
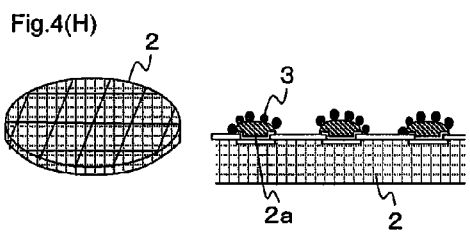

Next, as illustrated in FIGS. 4(D) and 4(H), the semiconductor element 1 and the circuit board 2 are respectively diced by a blade dicing method or a laser dicing method.

Figure 4I:
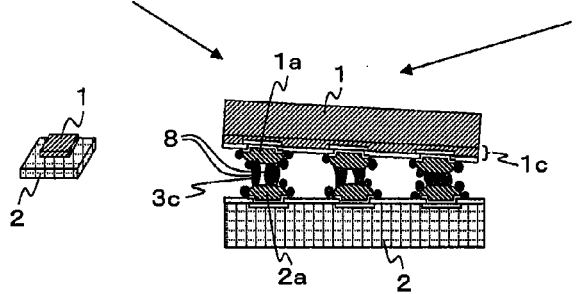

Next, as illustrated in FIG. 4(I), after aligning the semiconductor element 1 with the electrode terminals 2a of the circuit board 2 so that the electrode terminals 2a oppose the projecting electrodes 1a of the semiconductor element 1, heat is applied, and the semiconductor element 1 is mounted onto the circuit board 2 at a low load while applying a lifting load. For example, pressurization is to be performed at a heating temperature ranging from 210 to 230° C. for a pressurization time ranging from 2 to 9 seconds under a nitrogen gas atmosphere.

Moreover, flux or an encapsulation resin containing a flux component may be supplied before mounting the semiconductor element 1. Even with the fine solder particles that are difficult to melt, the use of flux improves solder wettability and makes it easier to form minute solder joint bodies 8.

At this point, although parallelism of the semiconductor element 1 and the circuit board 2 is negatively affected by mounting with a low load, since a portion of the minute solder joint body 8 expands in a drum shape and achieves a joint as illustrated in FIG. 4(I), the deterioration in parallelism can be absorbed.

A cross-sectional analysis by cross section polish of a semiconductor device fabricated by the manufacturing method according to the present third embodiment confirmed that the space between the semiconductor element 1 and the circuit board 2 is largest at the outermost projecting electrode 1a and electrode terminal 2a and an outermost solder joint 3c is made up of two minute solder joint bodies 8, and that no peeling and cracking had occurred at a fragile low-dielectric-constant insulating film. Furthermore, a temperature cycling test (1 cycle: −55° C., 125° C., each for 5 minutes) performed on the semiconductor device revealed that stable connection resistance can be secured even at 1000 cycles.

As shown, in a case where the solder particles 3 are attached on both the side of the projecting electrodes 1a of the semiconductor element 1 and the side of the electrode terminals 2a of the circuit board 2, since an effect of alleviating stress in a shear direction that is received during a temperature cycling test can be achieved by constituting the solder joint 3c at a position having the largest space between the semiconductor element 1 and the circuit board 2 with two or more minute solder joint bodies 8 and increasing the height of the minute solder joint bodies 8, stress acting on the fragile low-dielectric-constant insulating film can be further reduced and high connection reliability can be secured.

In addition, FIGS. 5(A) and 5(B) are plan views conceptually illustrating a solder particle-adhering base material according to the present third embodiment, and FIG. 5(C) is a cross-sectional view conceptually illustrating a semiconductor device according to the present third embodiment.

In FIG. 5(A), fine small solder particles 3a are arranged distributed on a base material 6a having the adhesive layer 5 applied to an entire surface thereof. In FIG. 5(B), fine large solder particles 3b are arranged distributed on a base material 6b having the adhesive layer 5 applied to the entire surface thereof. In this case, the particle diameter of the small solder particle 3a is smaller than the particle diameter of the large solder particle 3b and desirably equal to or smaller than ½ the particle diameter of the large solder particle 3b. In addition, space (pitch) between centers of the small solder particles 3a is smaller than space (pitch) between centers of the large solder particles 3b.

In FIG. 5(C), fine solder particles are diffusion-bonded on the respective projecting electrodes 1a and electrode terminals 2a by the manufacturing method described above using the base material 6b to which the large solder particles 3b are adhered as a semiconductor element 1 and the base material 6a to which the small solder particles 3a are adhered as a circuit board 2. Due to this process, the large solder particles 3b are diffusion-bonded to electrodes on the semiconductor element 1 and the small solder particles 3a are diffusion-bonded to the electrodes on the circuit board 2.

Furthermore, in the process of mounting the semiconductor element 1 on the circuit board 2 (FIG. 4(I)), since the semiconductor element 1 is mounted on, and meshes with, the circuit board 2 in such a manner that the small solder particles 3a on the electrode terminals 2a of the circuit board 2 penetrate into gaps between the large solder particles 3b on the projecting electrodes 1a of the semiconductor element 1, the aforementioned minute solder joint bodies 8 can be formed while suppressing misalignment of the semiconductor element 1 and the circuit board 2 in a planar direction even if warping of the circuit board 2 increases during heating.

Alternatively, the small solder particles 3a may be attached on the semiconductor element 1 and the large solder particles 3b may be attached on the circuit board 2.

Figure 6A:
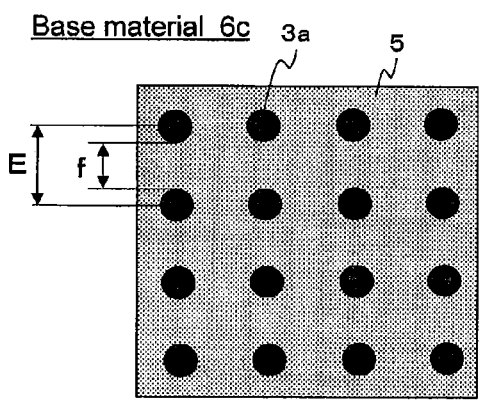
FIGS. 6(A) and 6(B) are plan views conceptually illustrating solder particle arrangements of another configuration of the solder particle-adhering base material according to the third embodiment of the present invention.
Figure 6B:
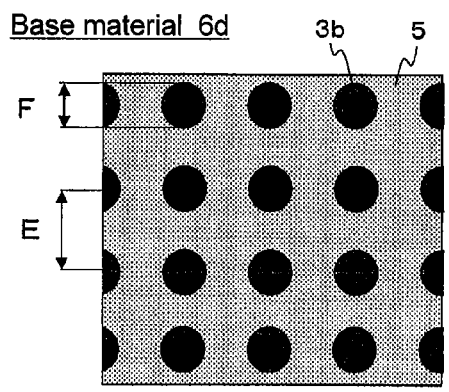
Figure 6C:
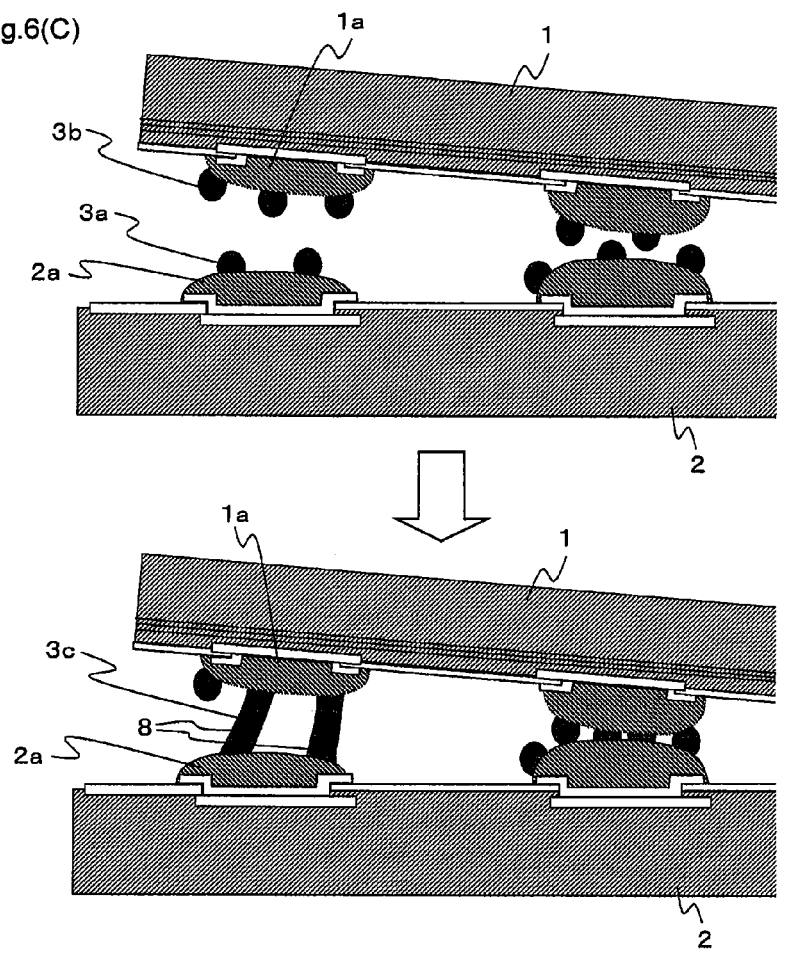
FIG. 6(C) is a cross-sectional view conceptually illustrating a process of mounting a semiconductor element on a circuit board when using solder particle-adhering base materials with the solder particle arrangements of the other configuration according to the third embodiment of the present invention.
Figure 7:
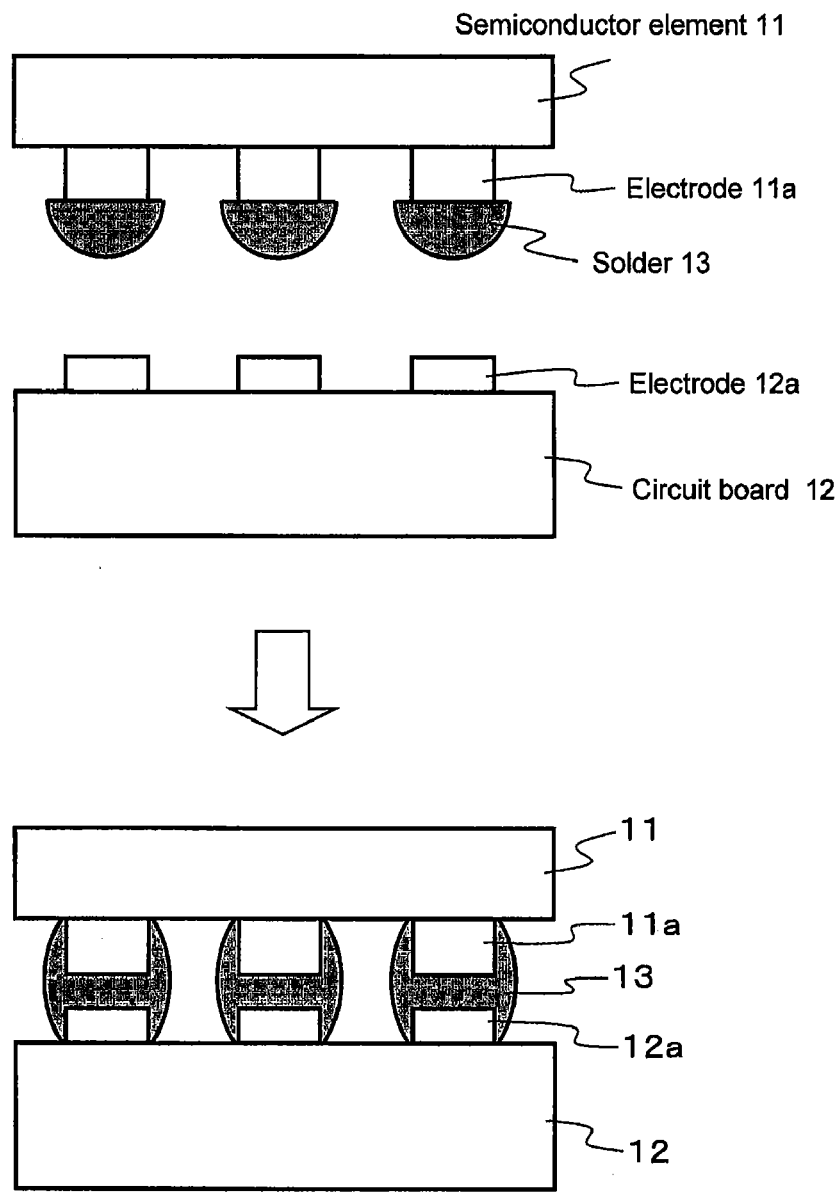
FIG. 7 is a cross-sectional view conceptually illustrating a conventional semiconductor device.
Figure 8A:
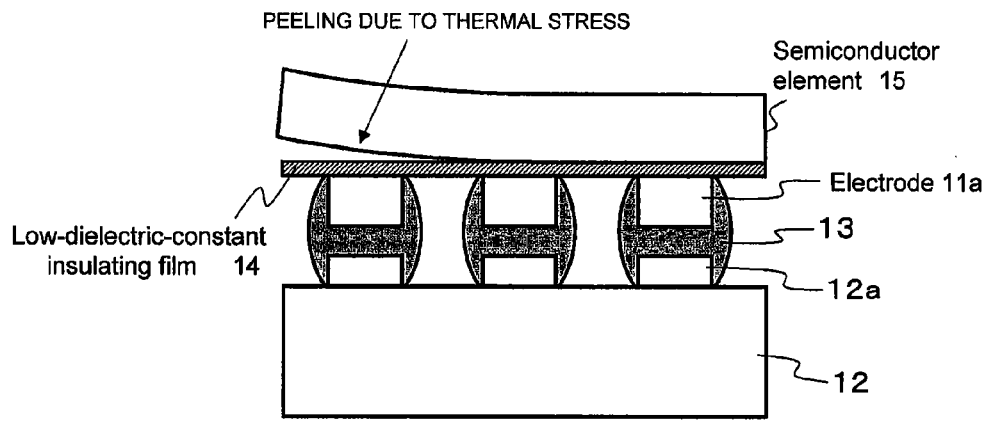
FIGS. 8(A) and 8(B) are cross-sectional views conceptually illustrating a semiconductor device during a cooling process after melting of solder in a flip-chip process when applying a conventional semiconductor device manufacturing technique.
Figure 8B:
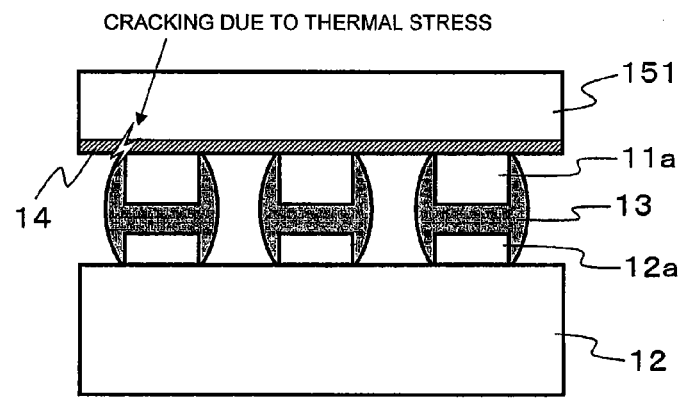

Furthermore, FIGS. 6(A) and 6(B) are plan views conceptually illustrating solder particle arrangements of another configuration of the solder particle-adhering base material according to the present third embodiment, and FIG. 6(C) is a cross-sectional view conceptually illustrating a process of mounting the semiconductor element 1 on the circuit board 2 when using solder particle-adhering base materials 6c and 6d illustrated in FIGS. 6(A) and 6(B).

In FIG. 6(A), the fine small solder particles 3a are arranged distributed on the base material 6c having the adhesive layer 5 for the circuit board 2 applied to an entire surface of the base material 6c. In FIG. 6(B), the fine large solder particles 3b are arranged distributed on the base material 6d having the adhesive layer 5 for the semiconductor element 1 applied to the entire surface of the base material 6d. In this case, the small solder particles 3a and the large solder particles 3b are both lined up at a same pitch E (a distance denoted by E in FIGS. 6(A) and 6(B) of space between centers of solder particles). In addition, a diameter F of the large solder particles 3b is equal to or smaller than a space if between adjacent particles of the small solder particles 3a.

Alternatively, the small solder particles 3a may be arranged on the projecting electrodes 1a of the semiconductor element 1 and the large solder particles 3b may be arranged on the electrode terminals 2a of the circuit board 2.

When processes similar to those described above are performed, in the process of mounting the semiconductor element 1 on the circuit board 2, as illustrated in FIG. 6(C), mounting is performed in such a manner that the small solder particles 3a on the electrode terminals 2a of the circuit board 2 penetrate into gaps between the large solder particles 3b on the projecting electrodes 1a of the semiconductor element 1. Therefore, since the large solder particles 3b and the small solder particles 3a may be alternately arranged, even if warping of the circuit board 2 or the like increases during heating and misalignment of the semiconductor element 1 and the circuit board 2 in a planar direction increases, the minute solder joint body 8 is formed by the large solder particle 3b and the small solder particle 3a having a narrower space. Accordingly, a set of the projecting electrode 1a of the semiconductor element 1 and the electrode terminal 2a of the circuit board 2 can be electrically connected via two or more minute solder joint bodies 8.

While the semiconductor element 1 has been exemplified and described as an electronic component in the respective embodiments above, the electronic component is not limited to the semiconductor element 1. A similar effect can be obtained when using a passive component such as a capacitor, a coil, or a resistor with a narrow pitch between electrode terminals. In addition, while a wafer form has been exemplified and described for a semiconductor element, the semiconductor element is not limited to the wafer form. A similar effect can be obtained when manufacturing the semiconductor element diced in rectangles or squares.

Furthermore, while a plurality of minute solder joint bodies are arranged so as to be formed on a single electrode by using solder particles 3 in the respective embodiments, solders with shapes other than a particle shape may be used as long as a plurality of minute solder joint bodies can be formed on a single electrode. For example, instead of attaching the solder particles 3 on an electrode, a similar effect can be obtained by arranging solder in fine string shapes on an electrode in a striped pattern.

According to the present invention, since thermal stress concentration at a corner electrode of a semiconductor device is received by soft and readily expandable minute solder joint bodies, thermal stress received by the fragile low-dielectric-constant insulating film immediately beneath the electrode is reduced. As a result, an advantage can be achieved in that peeling or cracking of the fragile low-dielectric-constant insulating film can be prevented and high connection reliability can be secured.

The present invention is capable of realizing high reliability even with narrow pitch connections and is particularly useful in the field of mounting of semiconductor elements for which pitch reduction is being promoted, semiconductor elements having an interlayer dielectric film made of a low-dielectric-constant insulating material, or the like.

The semiconductor device and the semiconductor device manufacturing method according to the present invention achieve an advantage of securing high reliability with a simple structure in a semiconductor element having a fragile film, and are particularly useful in the field of mounting of semiconductor elements for which pitch reduction is being promoted, semiconductor elements having an interlayer dielectric film made of a low-dielectric-constant insulating material, or the like.

What is claimed is:

1. A semiconductor device manufacturing method comprising the steps of:
    attaching two or more first solder particles on at least one electrode among a plurality of electrodes of an electronic component;
    attaching two or more second solder particles on at least one electrode among a plurality of electrodes of a circuit board;
    arranging the electrode of the electronic component and the electrode of the circuit board so as to oppose each other;
    performing at least one of abutting the first solder particles to the at least one electrode of the circuit board, abutting the second solder particles to the at least one electrode of the electronic component, and abutting the first solder particles to the second solder particles; and
    heating the first solder particles and the second solder particles, wherein
    in at least one set of electrodes arranged so as to oppose each other, the at least one electrode of the circuit board and the at least one electrode of the electronic component are connected electrically via two or more individually separated solder joint bodies made by melting the first solder particles and the second solder particles.

2. The semiconductor device manufacturing method according to claim 1, wherein
the first solder particles attached on the surface of the electrode of the electronic component and the second solder particles attached on the surface of the electrode of the circuit board have different particle spaces.

3. The semiconductor device manufacturing method according to claim 2, wherein
the first solder particles attached on the surface of the electrode of the electronic component and the second solder particles attached on the surface of the electrode of the circuit board have different particle diameters.

4. The semiconductor device manufacturing method according to claim 3, wherein
the particle space of the first solder particles attached on the surface of the electrode of the electronic component is greater than the particle diameter of the second solder particles attached on the surface of the electrode of the circuit board.

5. The semiconductor device manufacturing method according to claim 3, wherein
the particle space of the second solder particles attached on the surface of the electrode of the circuit board is greater than the particle diameter of the first solder particles attached on the surface of the electrode of the electronic component.

6. The semiconductor device manufacturing method according to claim 2, wherein
the particle space of the first solder particles attached on the surface of the electrode of the electronic component is greater than the particle diameter of the second solder particles attached on the surface of the electrode of the circuit board.

7. The semiconductor device manufacturing method according to claim 2, wherein
the particle space of the second solder particles attached on the surface of the electrode of the circuit board is greater than the particle diameter of the first solder particles attached on the surface of the electrode of the electronic component.

8. The semiconductor device manufacturing method according to claim 1, wherein
the first solder particles attached on the surface of the electrode of the electronic component and the second solder particles attached on the surface of the electrode of the circuit board have different particle diameters.

9. The semiconductor device manufacturing method according to claim 8, wherein
the particle space of the first solder particles attached on the surface of the electrode of the electronic component is greater than the particle diameter of the second solder particles attached on the surface of the electrode of the circuit board.

10. The semiconductor device manufacturing method according to claim 8, wherein
the particle space of the second solder particles attached on the surface of the electrode of the circuit board is greater than the particle diameter of the first solder particles attached on the surface of the electrode of the electronic component.

11. The semiconductor device manufacturing method according to claim 1, wherein
the particle space of the first solder particles attached on the surface of the electrode of the electronic component is greater than the particle diameter of the second solder particles attached on the surface of the electrode of the circuit board.

12. The semiconductor device manufacturing method according to claim 1, wherein
the particle space of the second solder particles attached on the surface of the electrode of the circuit board is greater than the particle diameter of the first solder particles attached on the surface of the electrode of the electronic component.

* * * * *